United States Patent
Kaneko

(10) Patent No.: US 6,389,271 B1
(45) Date of Patent: May 14, 2002

(54) RECEIVER WITH PROGRAM SELECTION

(75) Inventor: Shigeru Kaneko, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/077,310

(22) PCT Filed: Oct. 7, 1997

(86) PCT No.: PCT/JP97/03588

§ 371 Date: Jun. 4, 1998

§ 102(e) Date: Jun. 4, 1998

(87) PCT Pub. No.: WO98/16020

PCT Pub. Date: Apr. 16, 1998

(30) Foreign Application Priority Data

Oct. 7, 1996 (JP) .............................................. 8-284687

(51) Int. Cl.[7] .................................................. H64B 1/18
(52) U.S. Cl. .................... 455/185.1; 348/725; 348/468; 455/157.1; 455/158.4
(58) Field of Search ........................... 455/185.3, 185.1, 455/185.2, 180.3, 179.1, 180.1, 180.2, 161.1, 161.2, 192.1, 192.2, 195.1, 196.1, 197.1–197.3, 255, 257, 258–260, 158.2, 6.1, 2, 3.1, 4.2; 348/13, 27, 460, 461, 473, 906, 569, 563, 465–468; 345/327, 340, 969

(56) References Cited

U.S. PATENT DOCUMENTS

| 4,706,121 A | * 11/1987 | Young .......................... 348/27 |
| 4,977,455 A | * 12/1990 | Young .......................... 348/460 |
| 5,101,508 A | * 3/1992 | Owaki ...................... 455/158.2 |
| 5,355,527 A | * 10/1994 | Owaki ...................... 455/186.2 |
| 5,465,385 A | * 11/1995 | Ohga et al. ................... 455/6.1 |
| 5,465,402 A | * 11/1995 | Ono et al. ................ 455/161.2 |
| 5,465,403 A | * 11/1995 | Owaki ...................... 455/186.1 |
| 5,517,254 A | * 5/1996 | Monta et al. ................ 348/569 |
| 5,596,373 A | * 1/1997 | White et al. ................ 348/569 |
| 5,628,061 A | * 5/1997 | Shirakawa ................ 455/186.1 |
| 5,650,826 A | * 7/1997 | Eitz ............................ 348/468 |
| 5,671,411 A | * 9/1997 | Watts et al. ................. 707/104 |
| 5,710,994 A | * 1/1998 | Shiota ......................... 455/260 |
| 5,793,438 A | * 8/1998 | Bedard ........................ 348/569 |
| 5,956,455 A | * 9/1999 | Hennig ......................... 386/83 |
| 5,995,155 A | * 11/1999 | Schindler et al. ............ 348/461 |
| 6,005,565 A | * 12/1999 | Legall et al. ................ 345/327 |
| 6,018,772 A | * 1/2000 | Kamalski ..................... 709/236 |
| 6,057,890 A | * 5/2000 | Virden et al. ................ 348/563 |
| 6,078,348 A | * 5/2000 | Klosterman et al. .......... 348/10 |

FOREIGN PATENT DOCUMENTS

| JP | 403034630 A | * 2/1991 |
| JP | 405343955 A | * 12/1993 |

* cited by examiner

Primary Examiner—Dwayne D. Bost
Assistant Examiner—Charles Craver
(74) Attorney, Agent, or Firm—Jay H. Maioli

(57) ABSTRACT

Selection of a program in a DAB receiver is facilitated. There are provided a data table 31 containing sets of a service ID and a time data indicating a broadcast time of that program in order of the time as well as a data table 32 containing the service ID in order of receiving frequency of that program. When an operation for selecting a program is performed, it is checked whether or not a data coincident with a service ID of a program of the latest broadcast time among data of the data table 31 is found in the data table 32. As a result of this check, if it is found, a program of that service ID is selected. As a result of the check, if it is not found, the same processing is thereafter repeated to select a program, with a service ID of a program of the next latest broadcast time among data of the data table 31.

3 Claims, 8 Drawing Sheets

FIG. 2A

| ENSEMBLE ID | SERVICE ID | PROGRAM TYPE | BROADCAST DATE/TIME | | |
|---|---|---|---|---|---|
| | | | DATE | DAY OF THE WEEK | TIME |
| XXXX | XXXX | XX XX | 97 01 01 | 3 | 10:00 |
| XXXX | YYYY | YY YY | 97 01 01 | 3 | 10:30 |
| XXXX | XXXX | XX XX | 97 01 02 | 4 | 10:00 |
| XXXX | XXXX | XX XX | 97 01 03 | 5 | 10:00 |
| XXYY | YYYY | ZZ ZZ | 97 01 04 | 6 | 23:00 |

| PROGRAM TYPE |
|---|
| XX XX |
| YY YY |
| ZZ ZZ |

| ENSEMBLE ID | SERVICE ID | PROGRAM TYPE |
|---|---|---|
| XXXX | XXXX | XX XX |
| XXXX | XXYY | YY YY |
| XXXX | ZZZZ | XX XX |
| XXXX | JJJJ | JJ XX |
| XXXX | KKKK | KK XX |

| ENSEMBLE ID | SERVICE ID | PROGRAM TYPE | BROAD CAST DATE/TIME | | |
|---|---|---|---|---|---|
| | | | DATE | DAY OF THE WEEK | TIME |
| XXYY | YYYY | ZZ ZZ | 97 01 04 | 6 | 23:00 |
| XXXX | XXXX | XX XX | 97 01 03 | 5 | 10:00 |
| XXXX | XXYY | XX XX | 97 01 02 | 4 | 10:00 |
| XXXX | YYYY | YY YY | 97 01 01 | 3 | 10:30 |
| XXXX | XXXX | XX XX | 97 01 01 | 3 | 10:00 |

| ENSEMBLE ID | SERVICE ID | PROGRAM TYPE | BROADCAST DATE/TIME | | |
|---|---|---|---|---|---|
| | | | DATE | DAY OF THE WEEK | TIME |
| XXXX | XXXX | XX XX | 97 01 01 | 3 | 10:00 |
| XXXX | YYYY | YY YY | 97 01 01 | 3 | 10:30 |
| XXXX | XXXX | XX XX | 97 01 02 | 4 | 10:00 |
| XXXX | XXXX | XX XX | 97 01 03 | 5 | 10:00 |
| XXYY | YYYY | ZZ ZZ | 97 01 04 | 6 | 23:00 |

31

RECEIVER WITH PROGRAM SELECTION

TECHNICAL FIELD

The present invention relates to a receiver having a function for selecting a program.

BACKGROUND ART

When listening to a specific program by a radio receiver, it is a usual practice to turn a tuning knob or depress a selection key which is preset for a broadcasting station, thereby making a receiving frequency to be tuned to a frequency of a broadcasting station which is broadcasting that program.

However, in order to listen to the desired program in the above manner, it is necessary to remember a name or a frequency of the broadcasting station which is broadcasting that program, otherwise to see a program column of a newspaper and the like.

In Europe, a technology which is called a DAB (Digital Audio Broadcasting) and multiplex broadcasts a multiplicity of programs over a single radio wave is established. In this case of DAB, however, it is necessary to select a frequency or a broadcasting station and then further select a program. Selecting only a frequency or a broadcasting station will make it impossible to listen to a desired program.

As is evident from these facts, a conventional receiver has been made to select a broadcasting station based on its frequency, as a result of which a program is selected.

DISCLOSURE OF THE INVENTION

In view of the foregoing points, the present invention aims to provide a receiver by which a user can select a program based on the program itself.

A receiver according to the present invention comprises a first data table containing sets of a service ID and a time data indicating a broadcast time of that program in order of the time and a second data table containing the service ID in the order of a receiving frequency of its program. When performing an operation for selecting a program, it is checked whether or not a data coincident with a service ID of a program of the latest broadcast time among data of the first data table is found in the second data table. As a result of this check, if it is found, then a program of that service ID is selected. If it is not found as a result of the check, the same processing is thereafter repeated to select a program, with a service ID of a program of the next latest broadcast time among data of the first data table.

Accordingly, it is possible to select and receive a program by specifying that program itself.

BRIEF DESCRIPTION OF DRAWINGS

FIG. 2 is a diagram showing an embodiment of a data table according to the present invention, FIG. 3 is a diagram for explaining the present invention.

BEST MODE FOR CARRYING OUT THE INVENTION

Figure 1:
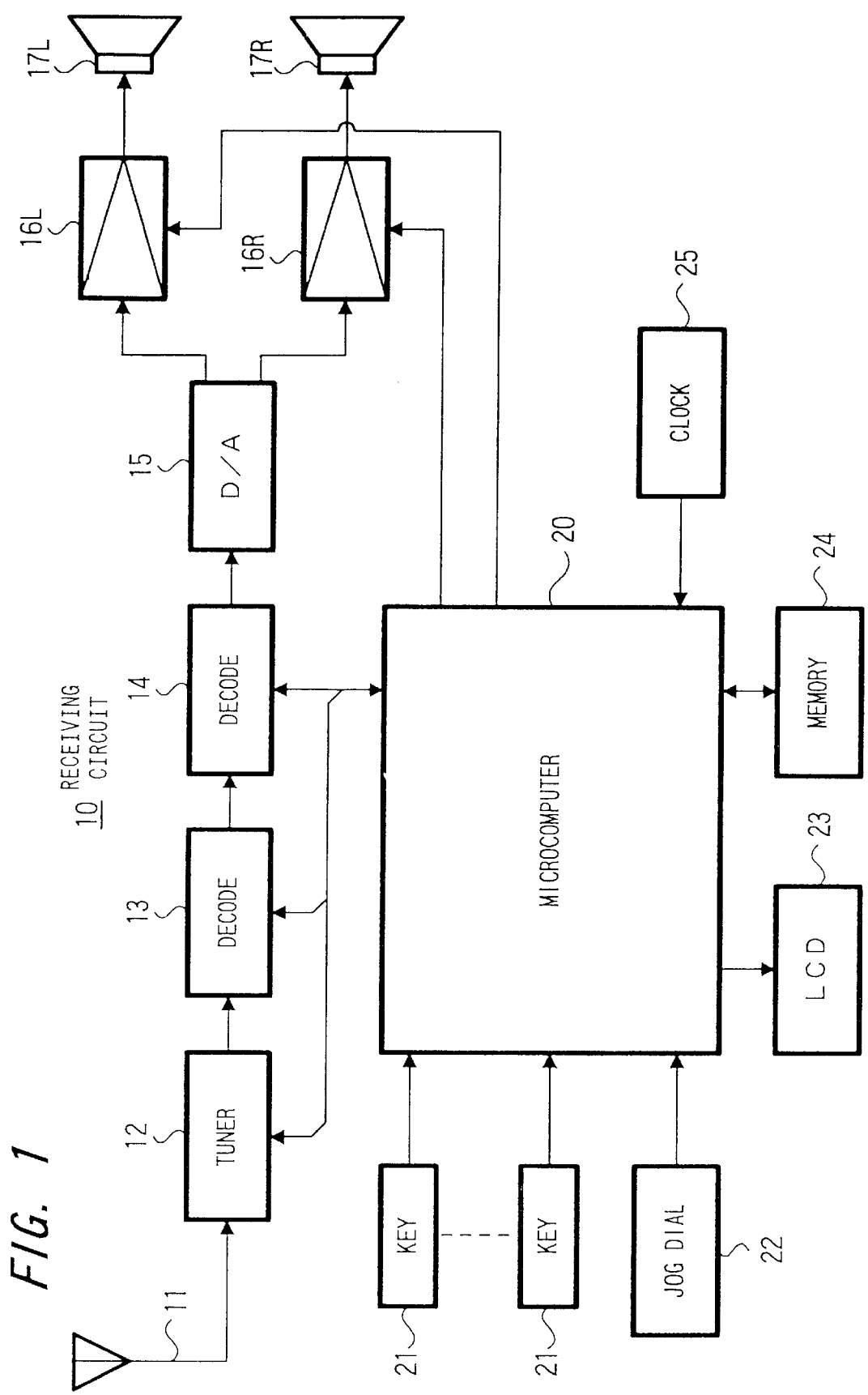
FIG. 1 is a systematic diagram showing an embodiment according to the present invention.

FIG. 1 shows an example where the present invention is applied to a radio receiver for the DAB. In a receiving circuit 10, a broadcast wave signal of the DAB is received by an antenna 11 and the received signal is supplied to a tuner circuit 12 including a front-end circuit of a synthesizer system to a demodulator circuit, from which digital data is derived. This digital data is a baseband signal in which a digital audio signal of a plurality of channels and various data are multiplexed according to the DAB standard.

The digital data is supplied to a transmissive path decoder circuit 13 where processings of deinterleave, error correction, selection of data of a desired program and the like are performed. The resulting data from the processings is supplied to an audio decoder circuit 14 which decompresses the data into an original digital audio signal. This digital audio signal is then supplied to a D/A converter 15 which D/A converts it into original analog audio signals of left and right channels. These audio signals are supplied to speakers 17L and 17R through amplifiers 16L and 16R, respectively.

Moreover, there is provided a microcomputer 20 for system control, and the processings of tuning in the tuner circuit 12, data selection of the desired program in the decoder cheroot 13, adjusting sound volumes and qualities of the audio signals through the amplifiers 16L, 16R and so on are performed by the microcomputer 20. At the same time, PAD (Program Associated Data) signal showing incident information of program contents is supplied from the decoder circuit 14 to the microcomputer 20.

Figure 5:
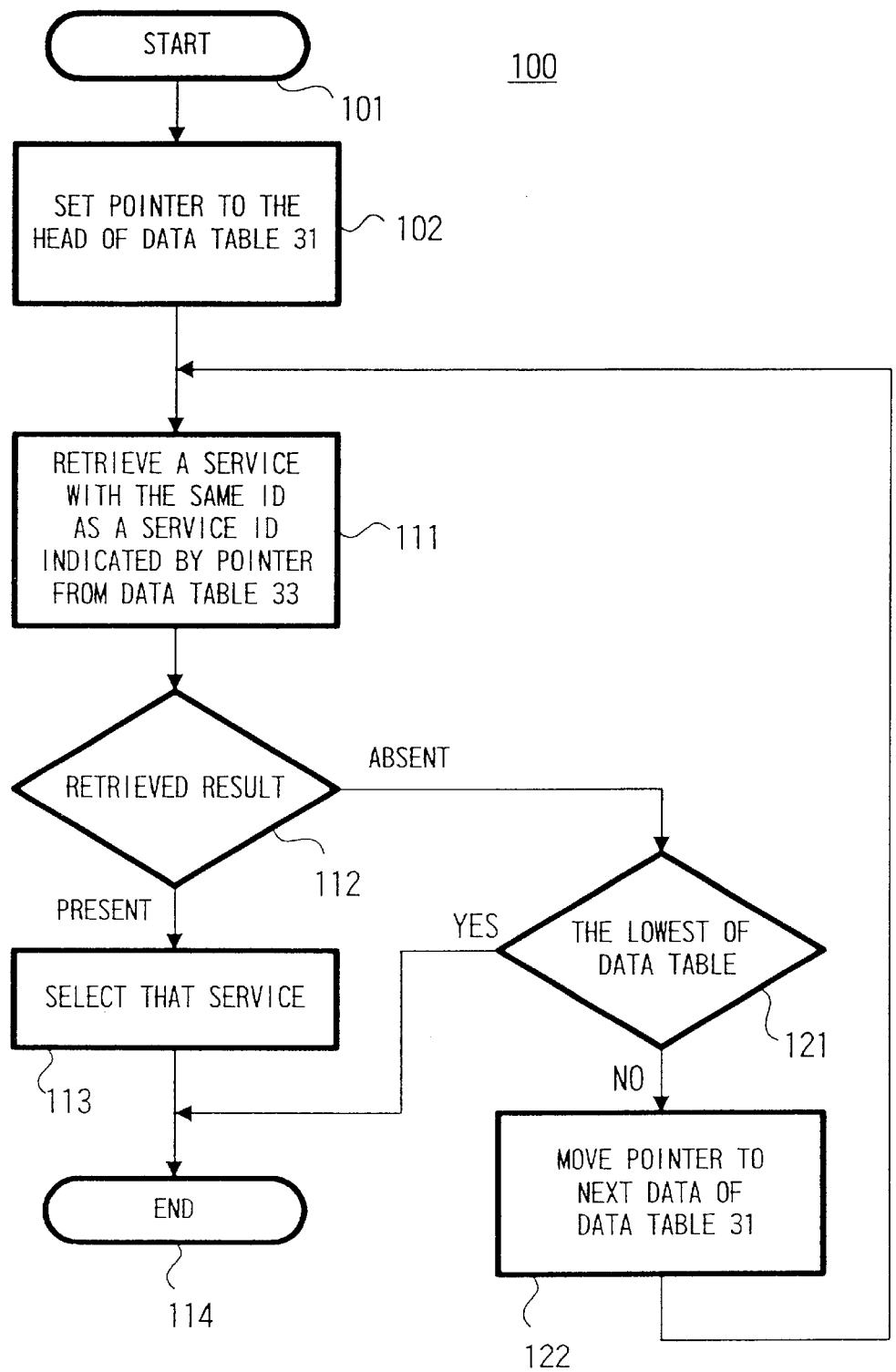
FIG. 5 and FIG. 6 are flow charts showing an embodiment according to the present invention, respectively.
Figure 6A:
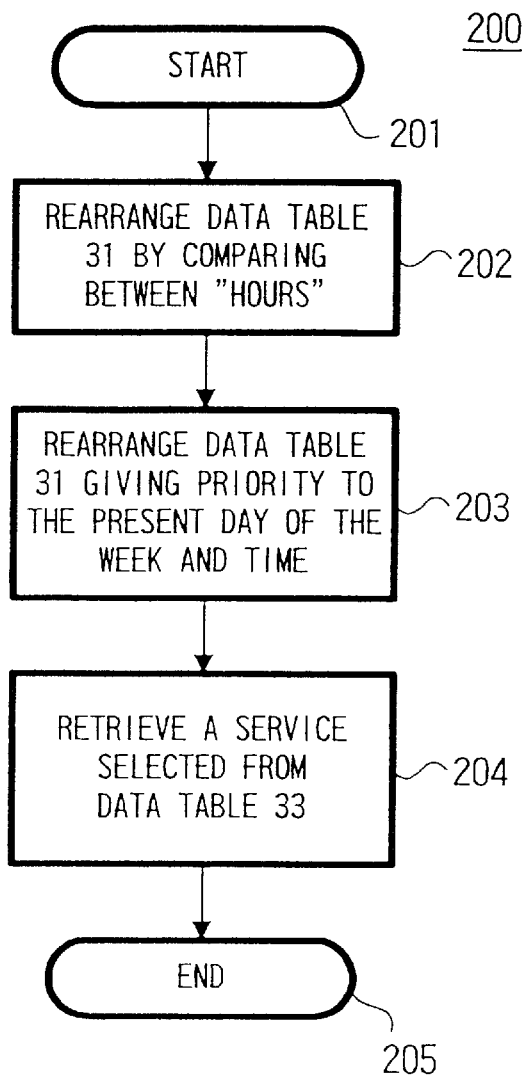
Figure 6B:
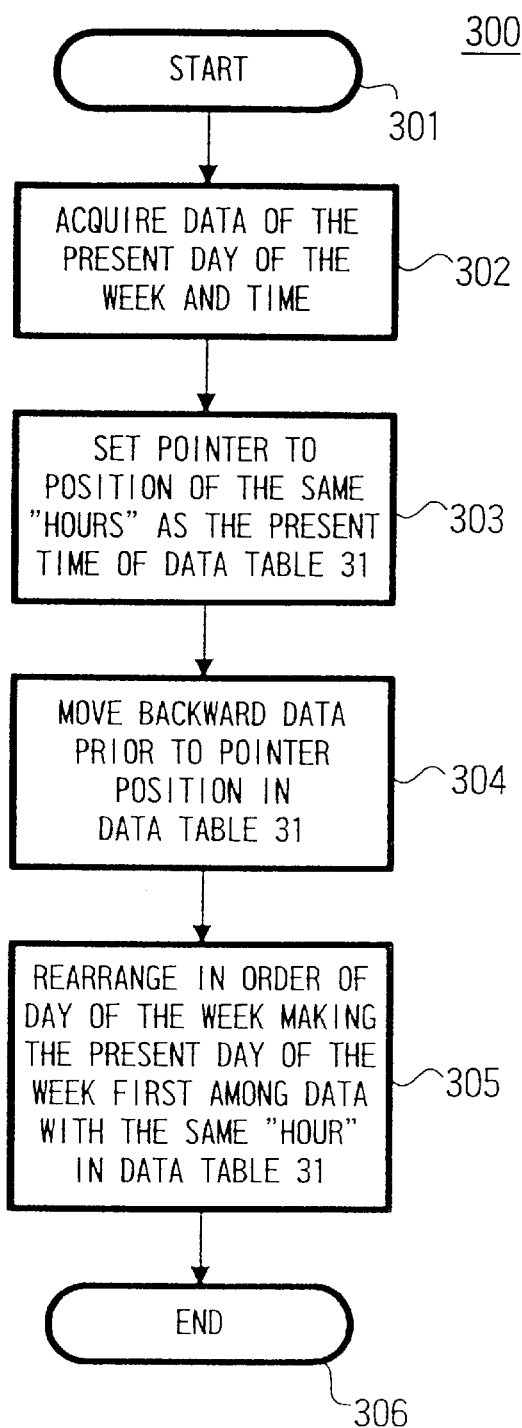

Furthermore, for example, routines 100 to 300 shown in FIG. 5 and FIG. 6 are provided in the microcomputer 20. Although processing contents of these routines 100 to 300 will be described below, these are to select and receive a program when the program is specified.

In addition, to the microcomputer 20 are connected a plurality of operation keys 21 and a jog dial 22 for performing various input operations, as well as a LCD 23 as a display device for displaying information on a broadcasting station and a program which are being received.

Moreover, a memory 24 and a clock circuit 25 for clocking a current time are connected to the microcomputer 20. In this case, the memory 24 may be a ROM into which data can be written electrically, or, though not shown, may be a RAM which is backed up by a battery. In other words, the memory 24 is made a nonvolatile memory which can hold written data even if power supply is turned off.

For example, data tables 31 to 33 as shown in FIG. 2 are provided in this memory 24. In this case, the data table 31 is to show a history of selecting services and therefore has data columns of ensemble ID, service ID, program type and broadcast date/time concerning programs selected in the past. The data table 32 indicates selecting frequencies of programs and has a data column of program type. Finally, the data table 33 is to show currently selectable services and as data columns of ensemble ID, service ID and program type.

Every time when a program selection takes place, the oldest data of the data table 31 is replaced with data of that program and data of the date/time indicated by the clock circuit 25, thus causing the data table 31 to be renewed. Further, according to data of the selected program, the data table 32 is rearranged in the order of the frequencies of programs and the data table 33 is also renewed.

Figure 4A:
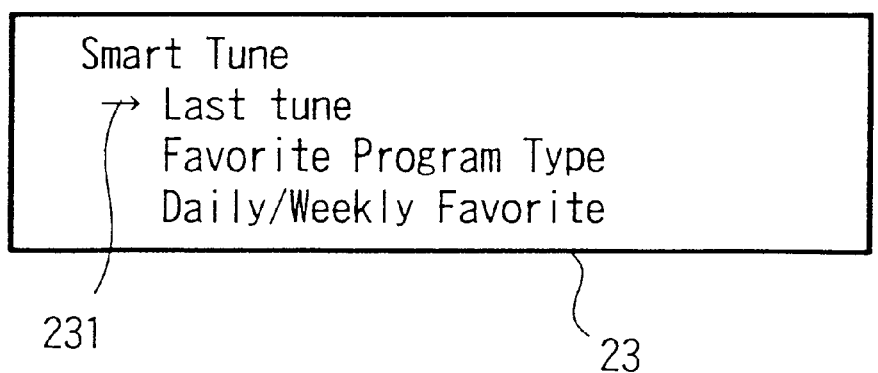
FIG. 4 is a diagram showing a display example in the present invention.

In this arrangement, when a predetermined key of the plurality of keys 21 is operated, as is shown in FIG. 4A, for example, a menu showing program selecting modes is displayed on LCD 23 and at the same time a cursor arrow mark 231 is displayed at the head of the first item of the menu displayed. Then, when a knob of the jog dial 22 is turned in a clockwise or counterclockwise direction, the cursor arrow mark 231 moves upward or downward between the items.

In this example, the following modes are prepared as the program selecting modes.
(1) a selecting mode according to the latest history priority.
(2) a selecting mode according to frequency order of program type, and
(3) a selecting mode according to service priority during the same time zone.

In these selecting modes, the selection of a program is performed as follows.
(1) Selecting mode according to the latest history priority.

Turning the jog dial 22 enables to move the cursor arrow mark 231 in FIG. 4A in sequential manner. For example, when making the cursor arrow mark 231 located at the first item and pushing the jog dial 22 as it is, "Selecting mode according to the latest history priority" of the first item will start.

In this selecting mode, data of the data table 31 is rearranged, as shown in FIG. 3A, for example, in order of newness according to data of the broadcast date/time in a manner that data of ensemble ID, service ID, program type and broadcast date/time are combined as one set data.

Subsequently, it is checked whether or not a service ID of the latest broadcast date/time, i. e. a service ID coincident with the service ID "YYYY" in the first line of data of the rearranged data table 31 (FIG. 3A) is found in the data table 33 showing the currently selectable services in FIG. 2C. In the present instance, it is not found. Thus, it is then checked whether or not a service ID of the next latest broadcast date/time, i.e. a service ID coincident with the service ID "XXXX" in the second line of data of the data table 31 is found in the data table 33.

Figure 4B:
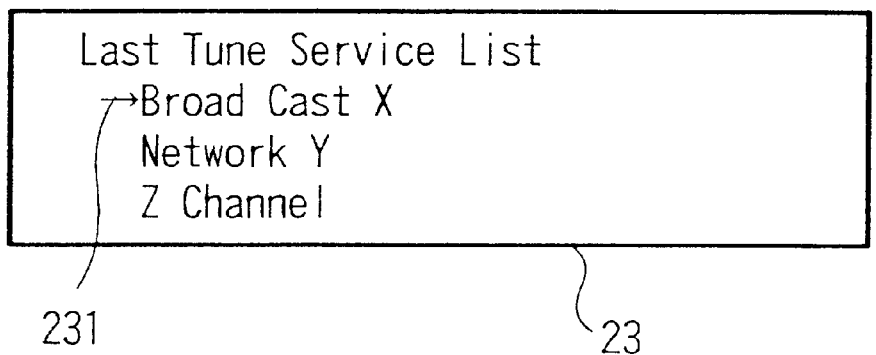

In the present instance, because it is found in the first line of the data table 33, selecting the program is performed according to this service ID and thereafter the selected state, i.e. received state of that program will continue. At this time, as shown in FIG. 4B, for example, the information on that selection is displayed in the LCD 23.

At that time, when the joy dial 22 is further turned, e.g. in the clockwise direction, the selection of next candidate will start. That is to say, it is checked whether or not a service ID of the thirdly latest broadcast date/time, i.e. a service ID coincident with the service ID "XXYY" in the third line of data of the data table 31 is found in the data table 33. In the present instance, because it is found in the second line of the data table 33, selecting the program is performed according to this service ID and thereafter the selected state of that program will continue. This means that the program of next candidate has been selected.

In this way, turning the jog dial 22 makes a program of subsequent candidate to be selected in the same manner. If there is no program for the candidate, the selection is then performed returning to the initially selected program. Of course, when the jog dial 22 is turned in the counterclockwise direction, an operational opposite to that when turned in the clockwise direction will be performed. In other words, a previous candidate will be selected.
(2) Selecting made according to frequency order of program type After depressing a predetermined key 21, the jog dial 22 is turned to make the cursor arrow mark 231 located at the second item in FIG. 4A. When the jog dial 22 is pushed as it is, "Selecting mode according to frequency order of program type" of the second item will start.

In this selecting mode, it is checked whether or not a program type of the highest receiving frequency program, i.e. a program type coincident with the program type "XXXX" in the first line of data of the data table 32 (This is always rearranged in frequency order.) is found in the data table 33 showing the currently selectable services. In the present instance, because it is found in the first line of the data table 33, selecting the program is performed according to this service ID and thereafter the selected state of that program will continue.

At this time, further turning the jog dial 22 in the clockwise direction, an operation for selecting a next candidate will start. That is to say, it is checked whether or not a program type of the next highest receiving frequency program, i.e. a program type coincident with the program type "YYYY" in the second line of data of the data table 32 is found in the data table 33. In the present instance, because it is found in the second line of the data table 33, selecting the program is performed according to this service ID and thereafter the selected state of that program will continue. This means that the program of next candidate has been selected. Of course, if the jog dial 22 is turned in the counterclockwise direction, a sequentially previous candidate, i.e. a sequentially higher receiving frequency program will be selected.

Thus, by turning the jog dial 22, a program of subsequent candidate is selected in the same manner. If there is no program for the candidate, then the selection is performed returning to the initially selected program.
(3) Selecting mode according to service priority during the same time zone After depressing a predetermined key 21, the jog dial 22 is turned to make the cursor arrow mark 231 located at the third item in FIG. 4A. When the jog dial 22 is pushed as it is, "Selecting mode according to service priority during the same time zone" will start.

In this selecting mode, data of the data table 31 is rearranged, as shown in FIG. 3B, for example, in a predetermined order according to its broadcast date/time, in which the data of ensemble ID, service ID, program type and broadcast date/time are combined as one set data. Here, in a column of day of the week, 1 represents Monday, 2 represents Tuesday, 3 represents Wednesday, 4 represents Thursday, 5 represents Friday, 6 represents Saturday, and 7 represents Sunday.

That is, FIG. 3B shows a result of the rearrangement in a case where the present time is between ten and eleven o'clock on Wednesday. This rearrangement is made in a manner that data is arranged in order of day of the week giving a first priority to the present day of the week. On the same day of the week, it is arranged in order of time zone giving a first priority to the present time zone. In this case, for example, an exact ten o'clock and fifty-nine minutes after ten o'clock are both handled as a time between ten and eleven o'clock. In other words, a time pertinent to the same "hour" is handled as the same time zone.

Subsequently, it is checked whether or not a service ID coincident with a service ID "XXXX" in the first line of data of the rearranged data table 31 (FIG. 3B) is found in the data table 33 showing the currently selectable service. In the present instance, because it is found in the first line of the data table 33, selecting the program is performed according to this service ID and thereafter the selected state of that program will continue.

At this time, when the jog dial 22 is further turned in the clockwise direction, selecting the next candidate will start. That is to say, it is checked whether or not a service ID coincident with a service ID "YYYY" in the second line of data of the data table 31 is found in the data table 33. In the present instance, because it is not found in the data table 33, it is further checked whether or not a service ID coincident with a service ID "XXYY" in the third line of data of the data table 31 is found in the data table 33. In the present instance, because it is coincident to the service ID in the second line of the data table 33, selecting the program is performed according to this service ID and thereafter the selected state of that program will continue. This means that the program of next candidate has been selected. Of course, if the jog dial 22 is turned in the counterclockwise direction in a condition that this next candidate is selected, the sequentially previous candidate will be selected.

Thus, by operating to select the next candidate, a program of subsequent candidate is selected in the same manner. If there is no program for the candidate, the selection is then performed returning to the first selected diagram.

As described above, the receiver of FIG. 1 is capable of selecting a program in three kinds of selecting modes of (1) to (3) items and in any mode it is arranged to select a program itself based on the past receiving history, so that the selection of a desired program is facilitated. Moreover, since it is arranged to have a learning function, a user is able to select his favorite programs without any need of complicated settings.

A routine 100 shown in FIG. 5 is an example of routines for implementing "Selecting mode according to the latest history priority" of the aforesaid (1) item. For example, as is shown in FIG. 4A, when the cursor arrow mark 231 is located at the position of selecting mode of (1) item, if the jog dial 22 is pushed, processing by the CPU o f the microcomputer 20 will start from a step 101 of the routine 100. In a next step 102, a pointer is set to the first line of data lines of the data table 31 (FIG. 3A).

In the following step 111, a service ID coincident with a service ID in the position of pointer set in the step 102 is retrieved from the data table 33.

The retrieved result is distinguished in a step 112. If the coincident service ID is present, the processing will then advance from the step 112 to a step 113. Then, in the step 113 selecting the program of the coincident service ID is performed, and thereafter the routine 100 will end in a step 114.

If the coincident service ID is absent in the step 112, the processing will then advance from the step 112 to a step 121. In the step 121, it is decided whether or not the pointer set in the data table 31 is located at the lowest line of the data table 31. If it is not located at the lowest line, the processing will then advance from the step 121 to a step 122. In the step 122, the pointer is moved to the next line, in the present instance, the second line of the data table 31 and thereafter the processing will return to the step 111.

Thereafter, regarding a service ID of data lines after the second line in the data table 31, the steps 111 to 122 are repeated until a service ID coincident with that service ID is obtained from the data table 33. If the coincident service ID is obtained, the program of that service ID will then be selected by the step 113.

In addition, if the pointer is located at the lowest line of the data table 31 in the step 121, the processing will then advance from the step 121 to the step 114 where the routine 100 will end.

In this way, according to the routine 100, "Selecting mode according to the latest history priority" of (1) item can be implemented.

A routine 200 shown in FIG. 6A is an example of routines for implementing "Selecting mode according to service priority during the same time zone" of the aforesaid (3) item. Particularly, when the cursor arrow mark 231 is located at the position of selecting mode of (3) item, if the jog dial 22 is pushed, processing by the CPU of the microcomputer 20 will start from a step 201 and in a next step 202 data of the data table 31 is rearranged in order of time by comparing between "hours" of time.

In the following step 203, a further rearrangement of the rearranged data table 31 by the step 202 is performed giving the priority to the present time and day of the week. Thereafter, in a step 204, the resulting data table 31 in the step 203 and the data table 33 are used for performing the same processing as the routine 100 to select a broadcasting station, and in a step 205 the routine 200 will end.

In this case, the step 203 can be constructed, for example, as a routine 300. In the routine 300, processing will start from a step 301 and in a next step 302 data of the present time and day of the week are acquired from the clock circuit 25. In the following step 303, a pointer is set to a data line of the same "hour" as "hour" of the present time acquired by the step 302 among data lines of the data table 31 (FIG. 3A).

Next, in a step 304, a data located between the first line and the data line prior to the pointer set by the step 303 in data of the data table 31 is moved to the last rear part of the data table 31. In a step 305, the processed data of the data table 31 by the step 304 is rearranged, among data having the same "hour" of time, in order of day of the week so that the present day of the week acquired by the step 302 may be located ahead. Thereafter, the routine 300 will end in a step 306.

Thus, according to the routines 200 and 300, "Selecting mode according to serve priority during the same time zone" of (3) item can be implemented.

Figure 7:
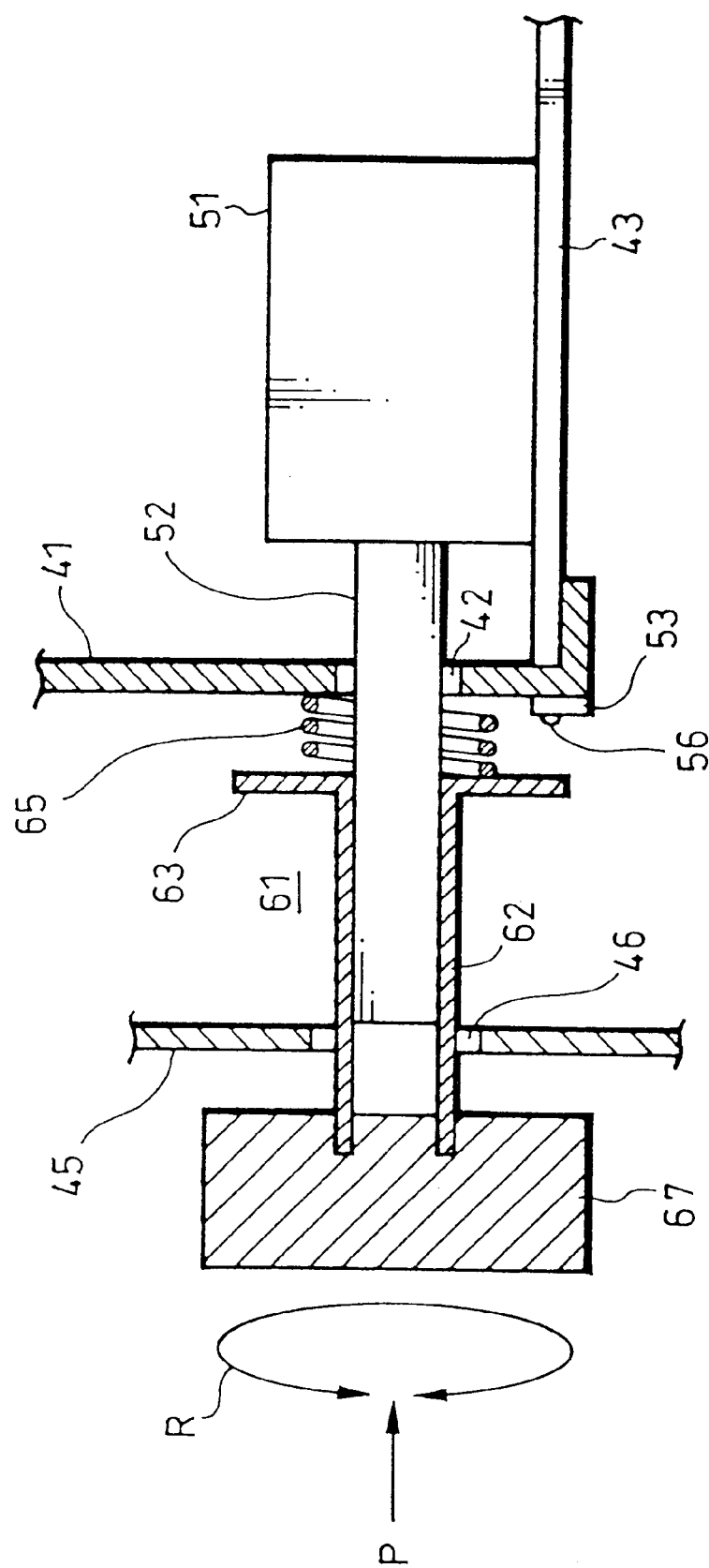
FIG. 7 is a sectional view showing an embodiment of a part in the present invention.
Figure 8:
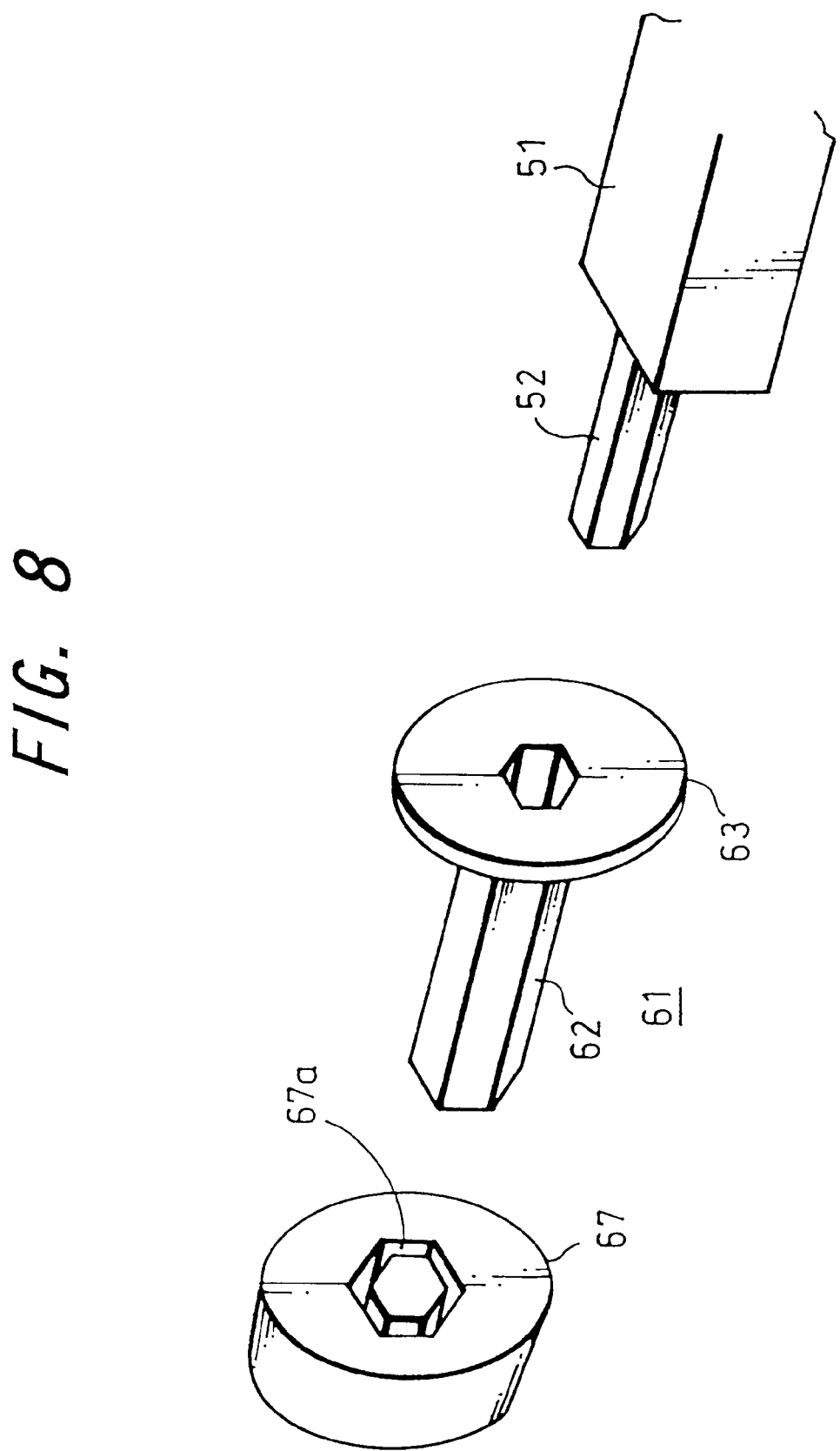
FIG. 8 is an exploded perspective view showing the embodiment of the part in the present invention.

FIG. 7 and FIG. 8 show the jog dial 22 used for the present embodiment. Specifically, a printed circuit board 43 is fixed to the rear part of a chassis 41 (right side in the figure). On the board 43 is mounted a rotary encoder 51 whose input shaft (operating axis) 52 extends to be positioned at the front side of the receiver through an aperture 42 in the chassis 41. Further, the input shaft 52 is made, e.g., hexagonal of its section.

A joint 61 has a cylindrical portion 62 and a flange portion 63 at an end of the cylindrical portion 62 which are formed integrally by using metallic or plastic materials. The cylindrical portion 62 is made, e.g. hexagonal of its section. The input shaft 52 is inserted into the cylindrical portion 62 in a condition that the flange portion 63 is directed toward the rotary encoder 51.

Further, at the time, between the flange portion 63 and the chassis 41 is provided a coil spring 65 concentrically with the input shaft 52, which biases the joint 61 in a direction away from the rotary encoder 51. The cylindrical portion 62 faces the front faces of a front panel 45 through an aperture 46 of the panel 45. The tip of the cylindrical portion is inserted into a hexagonal groove 67a provided in the rear face of a knob 67 and is adhered and fixed thereto.

In addition, on the chassis 41 is provided a microswitch 53, and an actuator (operating part) 56 of the microswitch 53 is opposed to the flange portion 63.

In this arrangement, the knob 67 is fixed to the cylindrical portion 62 of the joint 61. The cylindrical portion 62 is fit on the input shaft 52 of the rotary encoder 51 and because both sections of the cylindrical portion 62 and the input shaft 52 are made hexagonal, they are rotatively unified and rotatable in a rotative direction R.

Accordingly, turning the knob 67 makes the input shaft 52 to be turned together through the joint 61 and the rotary encoder 51 will output a signal which varies depending on the rotative direction and the rotative angle of the knob 67. Therefore, by this signal it is possible to implement the movement of the cursor arrow mark 231 and the change of the selecting mode displayed on the LCD 23, as described above.

Moreover, since the knob 67 can be pushed along the input shaft 52 in the direction of an arrow mark P against the bias force of the coil spring 65, when the knob 67 is pushed in the arrow mark direction P from a state of FIG. 7, the joint 61 will move in the P direction, i.e. the direction toward the chassis 41 and then the flange portion 63 of the joint 61 pushes the actuator 56 of the microswitch 53. Thus, pushing the knob 67 will cause a switching output from the microswitch 53 to be obtained, thereby allowing the aforesaid decision of the selecting mode, etc. to be performed. In this case, when the pushing force to the knob 67 is removed, the joint 61, i.e. the knob 67 will move in the direction opposite to the arrow mark P direction by the bias force of the coil spring 65 and return to the state of FIG. 7.

In this way, according to the jog dial 22, when the knob 67 is turned in the arrow direction R, the selection of the selecting mode can be performed, while when the knob 67 is pushed in the P direction, the decision of the selecting mode can be performed.

According to the present invention, because it is arranged to select a program itself based on the past receiving history, the selection of the desired program is made easier. Also, because of its learning function, it is possible for a user to select his favorite program without any need of complicated settings.

Further, while the above embodiment is arranged to perform the selection and decision of the selecting mode using the jog dial 22, it is also possible to perform that by operating keys.

| EXPLANATION OF REFERENCE NUMERALS | |
|---|---|
| 10 | RECEIVING CIRCUIT |
| 11 | ANTENNA |
| 12 | TUNER CIRCUIT |
| 13 | TRANSMISSION LINE DECODING CIRCUIT |
| 14 | AUDIO DECODING CIRCUIT |
| 15 | D/A CONVERTER |
| 20 | MICROCOMPUTER |
| 21 | OPERATION KEY |
| 22 | JOG DIAL |
| 23 | DISPLAY DEVICE |
| 24 | MEMORY |
| 25 | CLOCK CIRCUIT |
| 31 TO 33 | DATA TABLES |
| 51 | ROTARY ENCODER |
| 67 | KNOB |
| 100 TO 300 | ROUTINES |

What is claimed is:

1. A receiver comprising:

a first data table containing sets of a service ID and a time data indicating a broadcast time of a program in order of the time; and a second data table containing said service ID in order of a receiving frequency of its program, wherein when an operation for selecting a program is performed, it is checked whether a data coincident with a service ID of a program of the latest broadcast time among data of said first data table is found in said second data table, as a result of this check, if it is not found, the same processing is thereafter repeated to select a program, with a service ID of a program of the next latest broadcast time among data of said first data table, a third data table containing sets of said service ID and a program type, wherein when an operation for selecting a program is performed, it is checked whether a data coincident with a program type of a program of the highest receiving frequency among data of said second data table is found in said third data table, as a result of this check, if it is found, a program of a service ID forming a set with a program type is selected, and as a result of said check, if it is not found, the same processing is thereafter repeated to select a program, with a program type of a program of the next highest receiving frequency among data of said second data table.

2. A receiver comprising:

a first data table containing sets of a service ID and a time data indicating a broadcast time of a program in order of the time; and a second data table containing said service ID in order of a receiving frequency of its program, wherein when an operation for selecting a program is performed, it is checked whether a data coincident with a service ID of a program of the latest broadcast time among data of said first data table is found in said second data table, as a result of this check, if it is found, a program of that service ID is selected, and as a result of said check, if it is not found, the same processing is thereafter repeated to select a program. with a service ID of a program of the next latest broadcast time among data of said first data table, a third data table containing sets of said service ID and a program type, wherein as a result of this check, if it is found, a program of a service ID forming a set with that program type is selected, and as a result of a said check, if it is not found, the same processing is thereafter repeated to select a program, with a program type of a program of the next highest receiving frequency among data of said second data table, and wherein it is checked whether or not a data coincident with a service ID of the closest time to the present time among data of said first data table is found in said third data table, as a result of this check, if it is found, a program of the service ID is selected, and as a result of said check, if it is not found, the same processing is thereafter repeated to select a program, with a service ID of a program of the next closest time among data of said first data table.

3. A receiver comprising:

a first data table containing sets of a service ID and a time data indicating a broadcast time of that program in order of the time; and a second data table containing said service ID in order of a receiving frequency of its program, wherein
when an operation for selecting a program is performed, it is checked whether or not a data coincident with a service ID of a program of the latest broadcast time among data of said first data table is found in said second data table,
as a result of this check, if it is found, a program of that service ID is selected, and
as a result of said check, if it is not found, the same processing is thereafter repeated to select a program, with a serve ID of a program of the next latest broadcast time among data of said first data table,
a third data table containing sets of said service ID and a program type, wherein
when an operation for selecting a program is performed, it is checked whether or not a data coincident with a program type of a program of the highest receiving frequency among data of said second data table is found in said third data table,
as a result of this check, if it is found, a program of a service ID forming a set with that program type is selected, and
as a result of said check, if it is not found, the same processing is thereafter repeated to select a program, with a program type of a program of the next highest receiving frequency among data of said second data table, wherein
it is checked whether or not a data coincident with a service ID of the closest time to the present time among data of said first data table is found in said third data table,
as a result of this check, if it is found, a program of the service ID is selected, and
as a result of said check, if it is not found, the same processing is thereafter repeated to select a program, with a service ID of a program of the next closest time among data of said first data table.

* * * * *